United States Patent [19]

Miyagi

[11] Patent Number: 5,194,933
[45] Date of Patent: Mar. 16, 1993

[54] SEMICONDUCTOR DEVICE USING INSULATION COATED METAL SUBSTRATE

[75] Inventor: Masahide Miyagi, Kanagawa, Japan

[73] Assignee: Fuji Electric Co., Ltd., Kanagawa, Japan

[21] Appl. No.: 767,801

[22] Filed: Sep. 20, 1991

[30] Foreign Application Priority Data

Oct. 5, 1990 [JP] Japan .................. 2-267961

[51] Int. Cl.⁵ ............................................. H05K 3/28
[52] U.S. Cl. ........................... 257/753; 174/250; 257/790
[58] Field of Search ............... 357/68, 71, 72; 174/68.5

[56] References Cited

U.S. PATENT DOCUMENTS 4,528,064  7/1985  Ohsawa et al. ............... 156/630
4,677,252  6/1987  Takahashi et al. ............ 174/68.5

FOREIGN PATENT DOCUMENTS 1-232792  9/1989  Japan .

Primary Examiner—Eugene R. LaRoche
Assistant Examiner—Viet Q. Nguyen
Attorney, Agent, or Firm—Finnegan, Henderson, Farabow, Garrett and Dunner

[57] ABSTRACT

A semiconductor device using an insulation coated metal substrate includes semiconductor elements supported on an insulation coated metal substrate which is made of a metal substrate and an insulation layer disposed on the metal substrate, a wiring of a metallic foil formed on the insulation layer and connected to the semiconductor elements, an insulative sealing material covering the semiconductor elements and the wiring, and a solid insulation with a larger specific inductive capacity than that of the sealing material which is interposed between an edge part of the wiring and the sealing material.

5 Claims, 3 Drawing Sheets

SEMICONDUCTOR DEVICE USING INSULATION COATED METAL SUBSTRATE

BACKGROUND OF THE INVENTION

The present invention relates to a semiconductor device using an insulation coated metal substrate in which semiconductor elements are supported on the insulation coated metal substrate and the semiconductor elements are connected to a wiring made of a metal foil on the substrate.

Lately, remarkable development of electronic equipment has appeared and higher density integration and light-weight miniaturization are rapidly promoted. As a leading semiconductor device in the development, power modules which are widely used in inverters and others of motor controls and air conditioners are known.

FIG. 6 shows a common three-phase inverter circuit used for motor control. In FIG. 6, IGBTs are main circuit switching elements. In this example, six IGBTs are connected between a dc main electric power V by three-phase bridge coupling. A motor 9 is driven by a three-phase ac output of the inverter. A high speed diode 8 for transferring a current is connected to each IGBT 7 in reverse-parallel. A drive circuit 6 for driving IGBT 7 is provided for each IGBT. A drive electric power 10 is a dc electric power for the drive circuit 6. Such a circuit is actually assembled as shown in FIG. 7.

FIG. 7 shows a conventional package structure for a semiconductor device. In FIG. 7, a metal base plate 13 for heat radiation, a resin case 15 fixed by an adhesive so as to surround the base plate 13, and a case cover 16 for closing an upper opening of the case 15 constitute a container of the package, in which an assembly of module circuits comprised of semiconductor elements 12 mounted on insulation coated metal substrates 11 is incorporated and further a sealing resin 4 for sealing the interior of the container is filled. An external lead terminal 14 is extracted from the circuit assembly.

The power module is made up with a plurality of semiconductor elements which are supported on a substrate and connected with the wirings provided on the substrate. Previously, an insulated substrate made of a ceramic material such as $Al_2O_3$ has been used and a relatively thick copper base has been soldered to the substrate for the purpose of thermal radiation and the semiconductor elements have been fixed onto the copper base. However, to ensure higher density integration and light-weight miniaturization, an insulation coated metal substrate has been often used in which an aluminum plate with an excellent heat radiation efficiency is used as the substrate, an insulation layer which comprises an organic insulation is formed on this aluminum plate, copper foil of several tens of $\mu m$ in thickness is deposited on the insulation layer and the wiring is formed according to an appropriate patterning.

In case of the insulation coated metal substrate of such power module, an organic material which forms the insulation layer is apt to deteriorate due to corona discharge when a high voltage is applied irrespective of mounted elements and circuit structure and, if the voltage is continuously applied, dielectric breakdown will be finally caused. It is known from the measurement that the corona discharge starting voltage of the substrate alone is 400 to 600V. And it is known from the investigation that the portion where the corona was generated is an edge part of the wiring pattern which comprises copper foil (see a closed dot line E in FIG. 2 or 3). It appears that this is because the field concentrates to be increased at the edge of the copper pattern. For example, when a voltage of 200 V is applied to a metal substrate with an insulation layer of 100 $\mu m$ thickness, a large electric field of 2 kV/mm is applied to the substrate and the electric field concentrates to the edge of the copper pattern. As a measure, it can be considered that, for example as shown in FIG. 2, the edge part A of the pattern of Cu foil 3 formed on an aluminum substrate 1 via an insulation layer 2 made of an organic material is covered with a sealing material 4 such as molded resin so that the edge part may not be exposed to air and the corona discharge starting voltage may be increased. However, a preventive effect of this sealing material against deterioration of insulation was insufficient.

SUMMARY OF THE INVENTION

An object of the present invention is to provide a semiconductor device using an insulation coated metal substrate, which is capable of eliminating the above-mentioned disadvantages and preventing deterioration due to corona discharge even when a high voltage is applied.

To attain the object, the present invention provides a semiconductor device in which semiconductor elements are supported on an insulation coated metal substrate which is made up by depositing an insulation layer on a metal substrate and forming wiring of a metal foil on the insulation layer, the semiconductor elements are connected to the wiring of the metal foil, the semiconductor elements and the wiring are covered with an insulative sealing material, and a solid insulation with a larger specific inductive capacity than that of the sealing material is interposed between the edge part of the wiring pattern of the wiring of the metal foil and the sealing material.

The semiconductor device in accordance with the present invention is effective in that the sealing material is made of epoxy resin and the solid insulation is made of epoxy melamine-based resin or the sealing material is made of epoxy resin and the solid insulation is made of ferrite.

DETAILED DESCRIPTION OF THE INVENTION

The present invention will be described with reference to the accompanying drawings.

Figure 1:
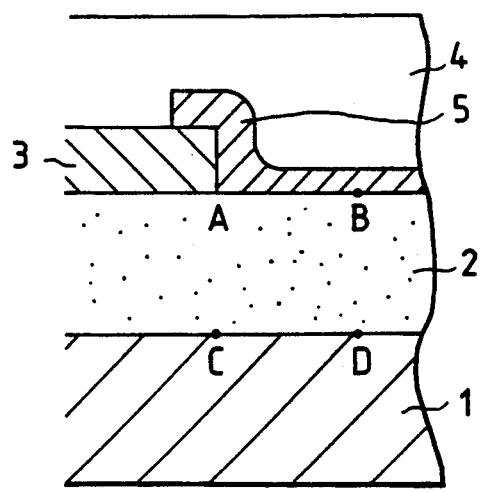
FIG. 1 is a cross sectional view of the edge part of the wiring of the semiconductor device according to an embodiment of the present invention.
Figure 2:
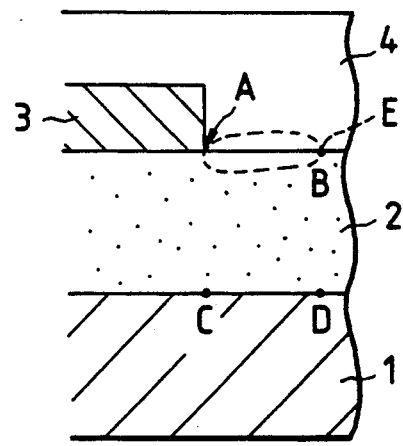
FIG. 2 is a cross sectional view of the edge part of the wiring of the conventional semiconductor device.
Figure 3:
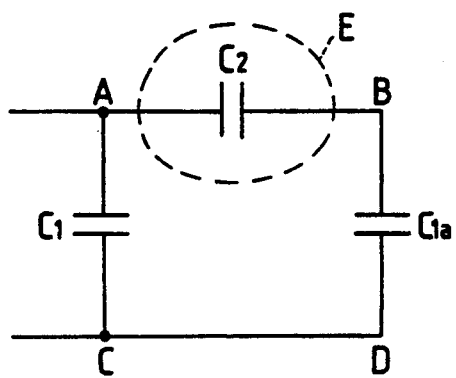
FIG. 3 is an equivalent circuit diagram shown in FIG. 2.
Figure 4:
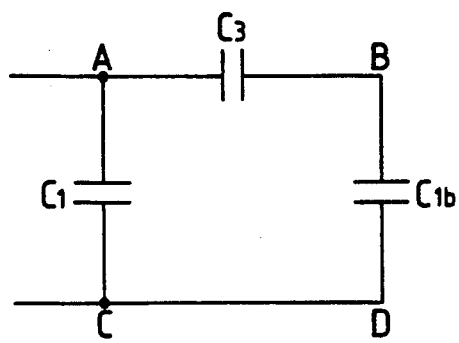
FIG. 4 is an equivalent circuit diagram shown in FIG. 1.

First, the principle of the present invention will be described with reference to FIGS. 1 to 4. Assuming, in FIG. 2, that a point on the interface of the sealing material 4 and the insulation layer 2 is B, and a point just below point A and a point just below point B on the interface of the insulation layer 2 and the metal substrate 1 are respectively C and D, capacitor $C_1$ is located between points A and C, capacitor $C_2$ between points A and B, and capacitor $C_{1a}$ between points B and D as shown in the equivalent circuit of FIG. 3. On the other hand, if a portion from the edge part of the wiring pattern 3 to the exposed surface of the insulation layer 2 is covered with the solid insulation 5 as shown in FIG. 1 (present invention), the equivalent circuit will be as shown in FIG. 4. It is assumed that voltage $V_2$ is applied to capacitor $C_2$ and voltage $V_{1a}$ to capacitor $C_{1a}$ in FIG. 3 and voltage $V_3$ is applied to capacitor $C_3$ and voltage $V_{1b}$ to capacitor $C_{1b}$ in FIG. 4. Voltage $V_{Emax}$ applied to wiring 3 will be as shown below:

$$V_{Emax} = V_2 + V_{1a}$$
$$= V_3 + V_{1b}$$

The potential generated at capacitors $C_2$ and $C_3$ when the voltage $V_{Emax}$ is applied is as shown below.

For capacitor $C_2$: $E_2 = V_{Emax} - V_2$    (1)

For capacitor $C_3$: $E_3 = V_{Emax} - V_3$    (2)

The discharge is commenced from a certain specified level of the generated potential. Thus, in case that the solid insulation 5 is interposed, the relationship of $E_3 > E_2$ should be established to enable discharging at a larger potential than that in case only the sealing material 4 is provided. In order to establish the relationship, specific inductive capacity $\epsilon_3$ of the solid insulations need be larger than specific inductive capacity $\epsilon_2$ of the sealing material 4 since $V_2 > V_3$ must be established from equations (1) and (2), $C_2 < C_3$ because V is inverse proportional to C, and C is proportional to specific inductive capacity $\epsilon$.

Next, the preferred embodiments of the present invention will be described in detail with reference to FIGS. 1 and 5.

As shown in FIG. 1, copper foil 3 having 30 to 100 μm thickness is deposited on an insulation coated metal substrate made up by covering an aluminum substrate 1 having 1 to 3 mm thickness with an insulation layer 2 having 80 to 150 μm thickness made of an organic insulation material, and a wiring pattern is formed by etching. Semiconductor elements are fixed onto the wiring 3 or the insulation layer 2 and their electrodes are connected via conductors to the wiring 3. A solid insulation 5 such as epoxy melamine-based resin of specific inductive capacity $\epsilon = 4.8$ which has a thickness of 10 to 50 μm is formed over all the exposed surface of the insulation layer 2 by printing or the like so as to cover the edge part A of all the wiring 3 made of copper foil. In addition, a sealing material 4 is formed on the solid insulation and the wiring by injection-molding epoxy resin of $\epsilon < 4.2$ in a thickness of several hundreds of μm. Other structure is the same as that of a conventional device, and therefore the description will be omitted.

Separately, another semiconductor device using ferrite of $\epsilon = 9.5$ as the solid insulation 5 was made. As a result, in any case, the corona discharge starting voltage was improved to 1.2 kV or over though it was 0.4 to 1.0 kV for the molded sealing material.

Figure 5:
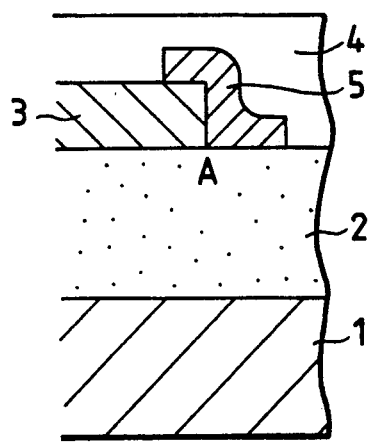
FIG. 5 is a cross sectional view of the edge part of the wiring of the semiconductor device according to another embodiment of the present invention.
Figure 7:
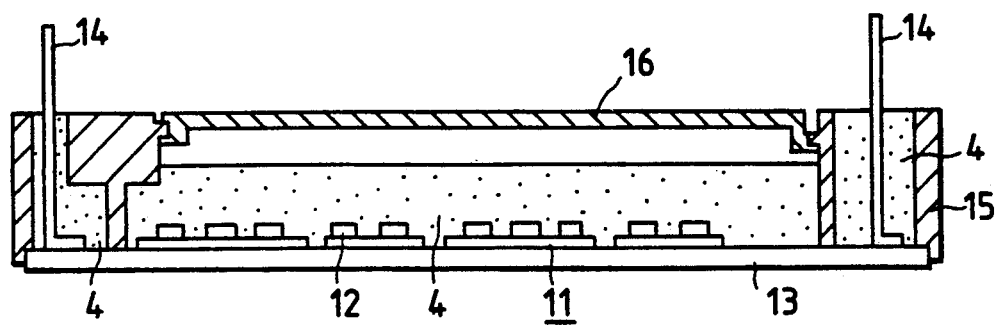
FIG. 7 is a view showing conventional package structure of the semiconductor device.
Figure 6:
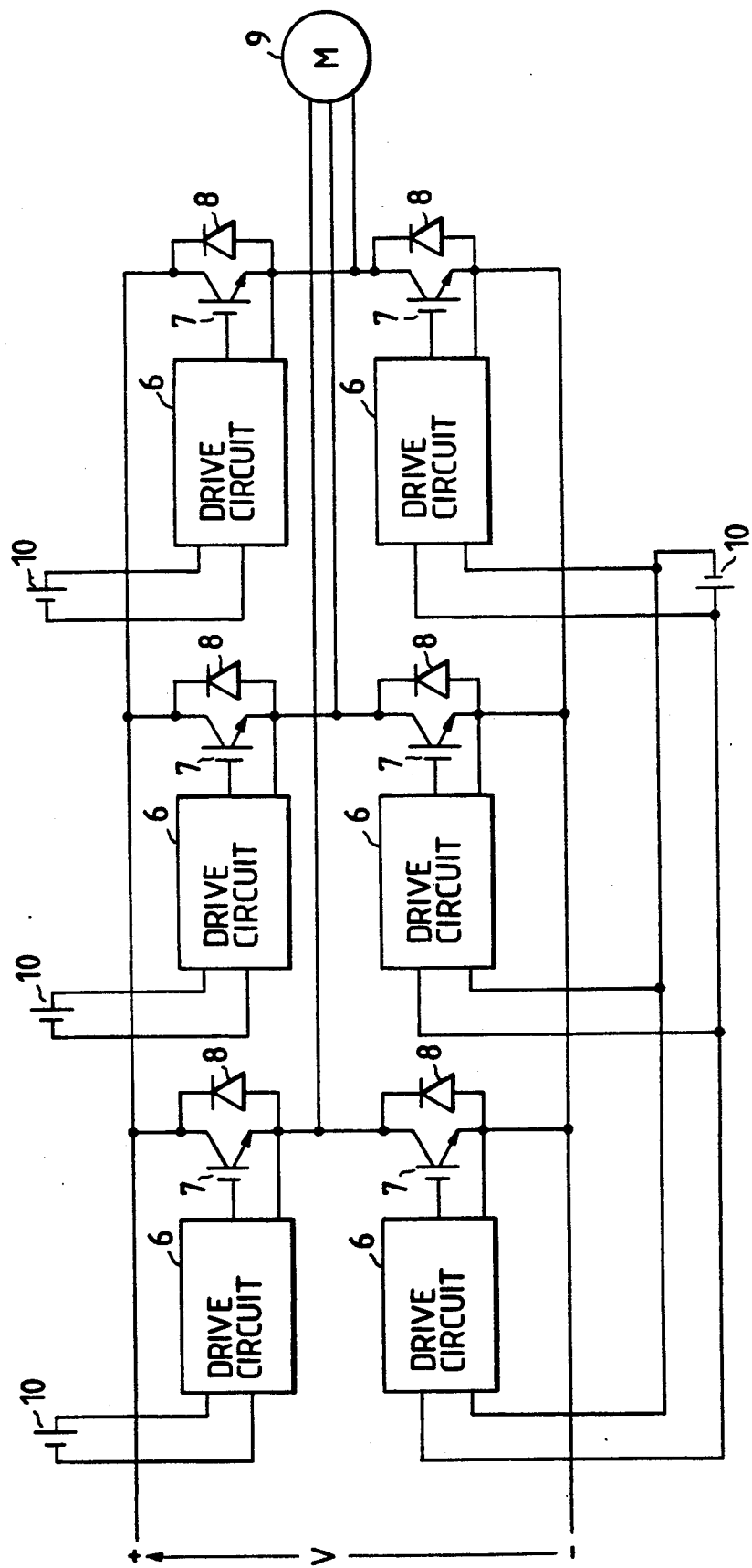
FIG. 6 is a circuit diagram showing a common three-phase inverter used for motor control.

FIG. 5 shows another embodiment of the present invention. In this case, though only the edge part A of all the wiring 3 is covered with the solid insulation 5, an improvement of the corona discharge starting voltage was similarly observed.

The present invention allows the corona discharge starting voltage of the insulation layer of the insulation coated metal substrate to be improved by covering the edge part of the wiring pattern with the solid insulation having a higher specific inductive capacity than that of the sealing material provided over the edge part. Epoxy melamine-based resin or ferrite can be effectively used as such solid insulation having a high specific inductive capacity when the sealing material is made of epoxy resin.

What is claimed is:

1. A semiconductor device using an insulation coated metal substrate, comprising:
   an insulation coated metal substrate formed of a metal substrate and an insulation layer disposed on said metal substrate;
   a wiring pattern of metallic foil formed on a surface of said insulation layer;
   semiconductor elements supported on said insulation coated metal substrate and connected to wiring pattern of said metallic foil;
   an insulating sealing material covering said semiconductor elements and said wiring pattern; and
   a solid insulation having a larger specific inductive capacity than that of said sealing material, said solid insulation being interposed between an edge part of said wiring pattern of metallic foil and said sealing material.

2. A semiconductor device using an insulation coated metal substrate in accordance with claim 1, wherein said sealing material is epoxy resin and said solid insulation is epoxy melamine-based resin.

3. A semiconductor device using an insulation coated metal substrate in accordance with claim 2, wherein said sealing material is epoxy resin and said solid insulation is ferrite.

4. A semiconductor device using an insulation coated metal substrate in accordance with claim 1, wherein said solid insulation is formed over all of the surface of the insulation layer exposed by said wiring pattern and over an edge part of said wiring pattern.

5. A semiconductor device using an insulation coated metal substrate in accordance with claim 1, wherein said solid insulation has a specific inductive capacity of approximately 4.8 and said insulating sealing material has a specific inductive capacity of less than 4.2.